United States Patent
Koyama

(10) Patent No.: US 7,696,910 B2
(45) Date of Patent: Apr. 13, 2010

(54) DITHER CIRCUIT AND ANALOG DIGITAL CONVERTER HAVING DITHER CIRCUIT

(75) Inventor: Tetsuhiro Koyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/073,087

(22) Filed: Feb. 29, 2008

(65) Prior Publication Data
US 2008/0238743 A1   Oct. 2, 2008

(30) Foreign Application Priority Data
Mar. 30, 2007   (JP)   ............... 2007-091124

(51) Int. Cl.
  *H03M 3/00*   (2006.01)
(52) U.S. Cl. ...................... 341/131; 341/155
(58) Field of Classification Search ................. 341/143, 341/155, 144, 131
See application file for complete search history.

(56) References Cited

U.S. PATENT DOCUMENTS

| | | | |
|---|---|---|---|
| 5,835,038 A * | 11/1998 | Nakao et al. ................ | 341/131 |
| 5,835,158 A * | 11/1998 | Lowe ........................... | 348/574 |
| 5,940,138 A | 8/1999 | Lowe | |
| 7,110,010 B1 * | 9/2006 | Masuji et al. ................ | 345/692 |
| 7,286,075 B2 * | 10/2007 | Hennessy et al. ........... | 341/172 |
| 7,304,592 B2 * | 12/2007 | Pinna et al. ................. | 341/143 |

FOREIGN PATENT DOCUMENTS

JP   2002-100992 A   4/2002

* cited by examiner

*Primary Examiner*—Peguy JeanPierre
(74) *Attorney, Agent, or Firm*—Foley & Lardner LLP

(57) ABSTRACT

According to one aspect of the present invention, there is provided a dither circuit including a dither generating circuit generating a plurality of complementary signal pairs, and a dither input circuit generating a plurality of dither signals from the plurality of complementary signal pairs to add the generated dither signals to an analog input signal, in which the plurality of complementary signal pairs have different frequencies with each other, the dither input circuit includes capacitors provided for each of the plurality of complementary signal pairs and a plurality of switch pairs including first and second switches having one terminals connected to each one terminal of the capacitors, and the other terminals of the capacitors are connected to an adding point to the analog input signal, the first switch supplies ones of the complementary signal pairs to one terminals of the capacitors when a clock signal is in effective state, and the second switch supplies the others of the complementary signal pairs to one terminals of the capacitors when an inverting clock signal of the clock signal is in effective state.

15 Claims, 10 Drawing Sheets

DITHER CIRCUIT AND ANALOG DIGITAL CONVERTER HAVING DITHER CIRCUIT

BACKGROUND OF THE INVENTION

1. Field of the Invention

The present invention relates to a dither circuit for a quantizer, and more particularly, to a dither circuit correcting quantization error generated in an analog digital converter (ADC).

2. Description of Related Art

In order to describe the background of the present invention, characteristic of an ADC without dither will be described with taking a ΔΣ (delta sigma) type ADC as an example. FIG. 6 is a configuration diagram of a first-order ΔΣ (delta sigma) ADC without dither signal. This first-order ΔΣADC functions as follows.

When a sampling clock ck is in active state, switches SWain and SWsam are closed and charges sampling analog input signal Vain are stored in an input capacitor C1. Next, when an inverting sampling clock ckb is in active state, switches SWdac and SWint are closed, and charges are transmitted to an integral capacitor C2 according to a feedback reference signal Vr. Then integration is performed in the C2 to change an integrator output Vout. The integrator output Vout is input to a comparator 3 which functions as a quantizer. A quantization output PDM, which is the output from the comparator 3, is delayed by one clock cycle by a delay device 4 and is input to a 1-bit digital analog converter (DAC) 6. The DAC 6 outputs a feedback reference signal Vr. The level of the feedback reference signal Vr has two values of Vrp and Vrn, and the level is determined to be Vrp or Vrn according to the value obtained by examining the previous integration result made by the comparator 3.

A decimation filter 5 obtains the quantization output PDM and removes high side out-of-band noise that is shaped by a delta sigma modulator 10. Then the decimation filter 5 thins out and changes the data output rate to a desired one to output the digital signal output Dout.

FIG. 7 shows output characteristics of the ΔΣ type ADC when an analog input signal is in the vicinity of zero. As shown in FIG. 7, there is a region where the digital output signal outputs constant value. This is because some loss is caused in the integrator. The loss is caused mainly because gain of an operational amplifier forming the integrator has limit, leak current is generated in the capacitor or the switch, or the integrator is not in an ideal state due to existence of parasitic element and soon. Due to this loss, the feedback reference signal is in a stationary state where the feedback reference signal repeats positive side and negative side when the analog input signal is in the vicinity of zero, and the digital output signal has constant value. Therefore, as shown in FIG. 8, the error is also increased when the analog input signal is in the vicinity of zero.

In order to improve this characteristic degradation, the stationary state where the feedback reference signal repeats positive side and negative side is needed to be avoided when the analog input signal is in the vicinity of zero. The process for adding the dither signals is typically used to achieve this object.

A conventional example of the first-order ΔΣ type ADC having a single square wave dither circuit is disclosed in Japanese Unexamined Patent Application Publication No. 2002-100992. FIG. 9 shows a configuration of the ΔΣ type ADC disclosed in Japanese Unexamined Patent Application Publication No. 2002-100992. With reference to FIG. 9, the ΔΣ type ADC includes a dither circuit 1, a switched capacitor type integrator 2, a quantizer 3 made of a comparator, a delay device 4 made of a flip-flop, a decimation filter 5, and a 1-bit DAC 6. FIG. 10 shows configurations of the dither circuit 1 of the ΔΣ type ADC and the 1-bit DAC shown in FIG. 9, and switched capacitors transmitting charges proportional to signal potentials generated at the dither circuit and the 1-bit DAC to an integral capacitor of the integrator 2.

Referring to FIG. 10, the 1-bit DAC 6 includes a switching device 31 controlled by an output Sd of the delay device 4. The switching device 31 outputs reference voltages V1 and V4 generated at the resistors 39 to 43 that are connected in series as a positive side Vrp=V1 and negative side Vrn=V4 of the feedback reference signal Vr, respectively.

The dither circuit 1 includes a switching device 37 controlled by signal obtained by dividing the frequency of sampling clock fs by n using a frequency divider. The frequency dividing ratio of the frequency divider is set so that the cycle of the dither signals becomes more than ⅛ of the output cycle of the decimation filter 5. The switching device 37 switches reference voltages V2 and V3 generated at the resistors 39 to 43 that are connected in series to output the square wave dither whose amplitude is V2-V3. A switched capacitor circuit includes switches 32 and 34 that function at a first timing, switches 35 and 36 that function at a second timing, and a capacitor 33. When the switches 35 and 36 are closed and the switches 32 and 34 are opened, potentials of both ends of the capacitor 33 are made ground potential. When the switches 35 and 36 are opened and the switches 32 and 34 are closed, the dither Vd is output to the input of the integrator 2 which is an adding point. There is a description in Japanese Unexamined Patent Application Publication No. 2002-100992 that the arbitrary waveform can be used as the dither such as delta wave or sawtooth wave although specific example is not shown in this patent.

In the ADC disclosed in U.S. Pat. No. 5,940,138, two square wave dithers having different frequencies and amplitudes are added to the analog video input signal. FIG. 11 shows a configuration of the ADC of U.S. Pat. No. 5,940,138, and FIG. 12 shows the dither waveform thereof. Referring to FIGS. 11 and 12, the dither is generated from the square wave having frequencies of ½ and ¼ of the sampling clock CLK obtained by dividing frequency of the sampling clock CLK using flip-flops 803B and 803C. The two square waves having frequencies of ½ and ¼ are added to the analog video input signal DATA output from a buffer amplifier 805 as the dither of the amplitude of ½ LSB P-P and ¼ LSB P-P by an adding device which includes weighted resistors R, 512R, and 1024R. Note that exclusive OR operation is performed on the signal obtained by dividing frequency of horizontal synchronizing signal H by 2 and the square wave having frequency of ½ of the sampling clock CLK at EX-OR 804A. Exclusive OR operation is also performed on the signal obtained by dividing frequency of horizontal synchronizing signal H by 2 and the square wave having frequency of ¼ of the sampling clock CLK at EX-OR 804B. After these exclusive OR operations, these signals are added to the adding device. Therefore, the ADC has a configuration where the polarity of the dither is inverted for each one horizontal line.

In the conventional dither using the single square wave as disclosed in Japanese Unexamined Patent Application Publication No. 2002-100992, there is an area where the digital output signal becomes constant as in the case without the dither when there is not so much difference between amplitude of the square wave and the analog input signal Vain. As shown in FIG. 13, characteristic improvement cannot be fully achieved in the area where there is not so much difference between the amplitude Vd of the square wave dither signals and the analog input signal Vain. Further, a voltage-dividing resistor for generating the potential having an intermediate level to determine the amplitude level of the dither is needed, which increases circuit size. Further, the DAC for generating arbitrary waveform is also needed when the arbitrary waveform (delta wave or sawtooth wave) is used in the dither, which increases circuit size.

In the conventional example disclosed in U.S. Pat. No. 5,940,138, the resistor that is 512 times or 1024 times larger than the resistor for analog signal input is needed to determine the amplitude of the dither, which increases the circuit size. In a small amplitude where the dither amplitude is $1/512$ or $1/1024$ of the analog signal input range, the phenomena where the digital output signal becomes constant when the analog input signal Vain is in the vicinity of zero cannot be improved.

SUMMARY

A dither circuit according to one embodiment of the present invention includes a dither generating circuit generating a plurality of complementary signal pairs, and a dither input circuit generating a plurality of dither signals from the plurality of complementary signal pairs to add the generated dither signals to an analog input signal, in which the plurality of complementary signal pairs have different frequencies with each other, the dither input circuit includes capacitors provided for each of the plurality of complementary signal pairs and a plurality of switch pairs including first and second switches having one terminals connected to each one terminal of the capacitors, and the other terminals of the capacitors are connected to an adding point to the analog input signal, the first switch supplies ones of the complementary signal pairs to one terminals of the capacitors when a clock signal is in effective state, and the second switch supplies the others of the complementary signal pairs to one terminals of the capacitors when an inverting clock signal of the clock signal is in effective state.

The dither generating circuit of the present invention generates a plurality of square waves having different frequencies. Therefore, it is possible to form the dither generating circuit only by the frequency divider and therefore to suppress the increase of the circuit size. The dither input circuit of the present invention can be formed by switches and a plurality of capacitors that are smaller than the capacitor for analog signal input, which makes it possible to suppress the increase of the circuit size. According to the dither circuit of the present invention to which these circuits are applied, it is possible to suppress the increase of the circuit size to improve the AD conversion characteristics when the analog input signal Vain is in the vicinity of zero and when another analog signal is input.

By adding the dither circuit of the present invention to a $\Delta\Sigma$ type ADC, it is possible to prevent the output of a $\Delta\Sigma$ modulator from being in a stationary state and to prevent the digital output signal from having a constant value. Therefore, it is possible to improve the AD conversion characteristics.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
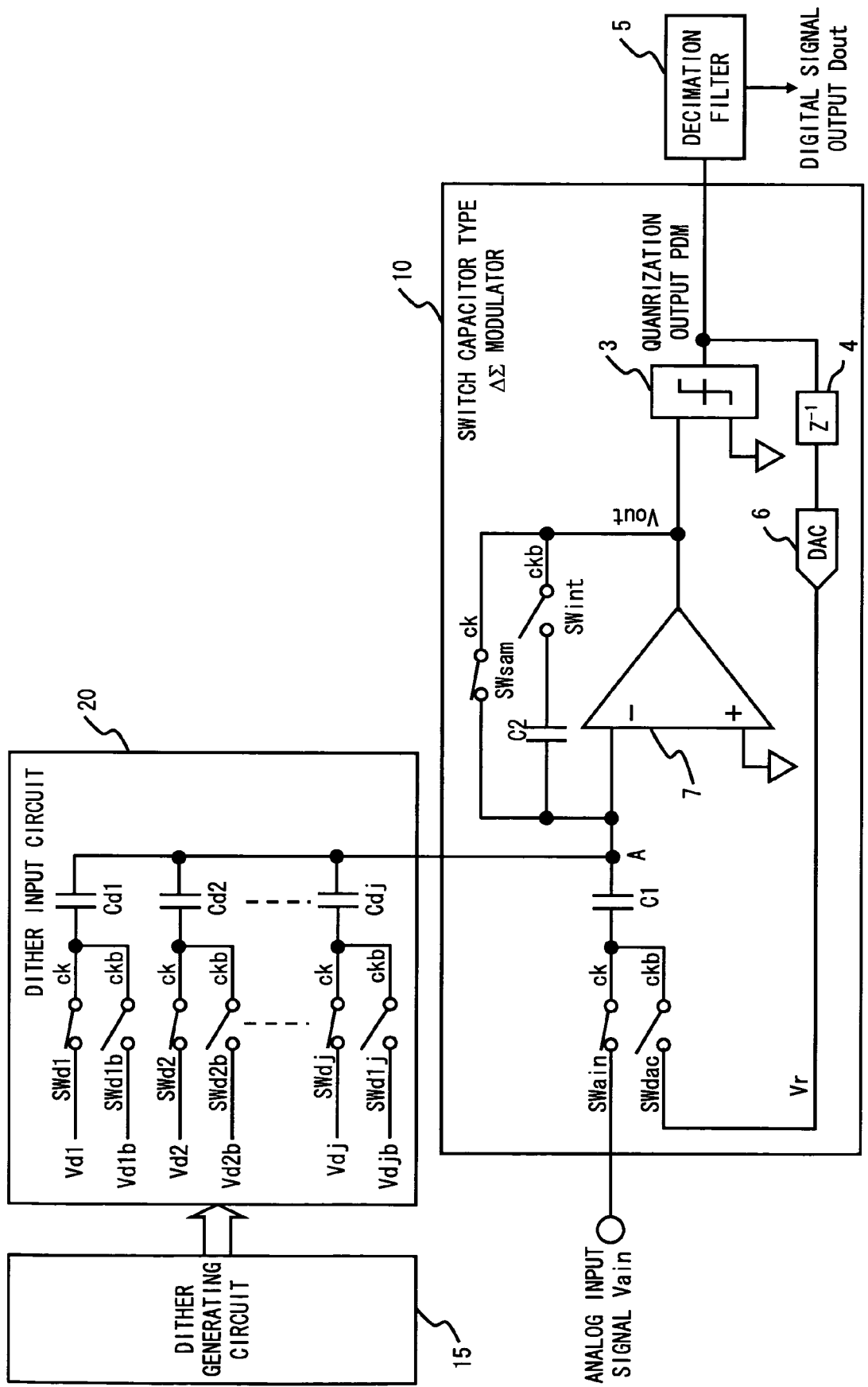
FIG. 1 shows a configuration of a $\Delta\Sigma$ ADC to which a dither circuit according to the present invention is added.
Figure 6:
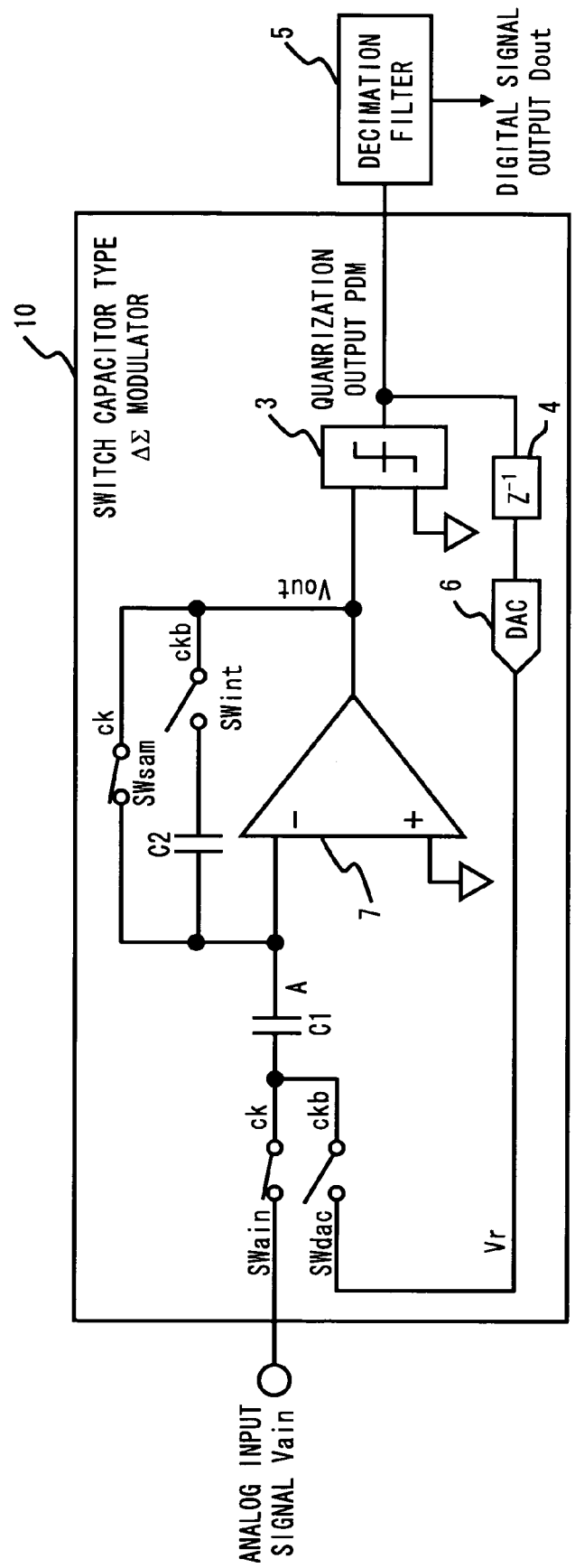
FIG. 6 shows a configuration of the $\Delta\Sigma$ ADC without dither signal.
Figure 7:
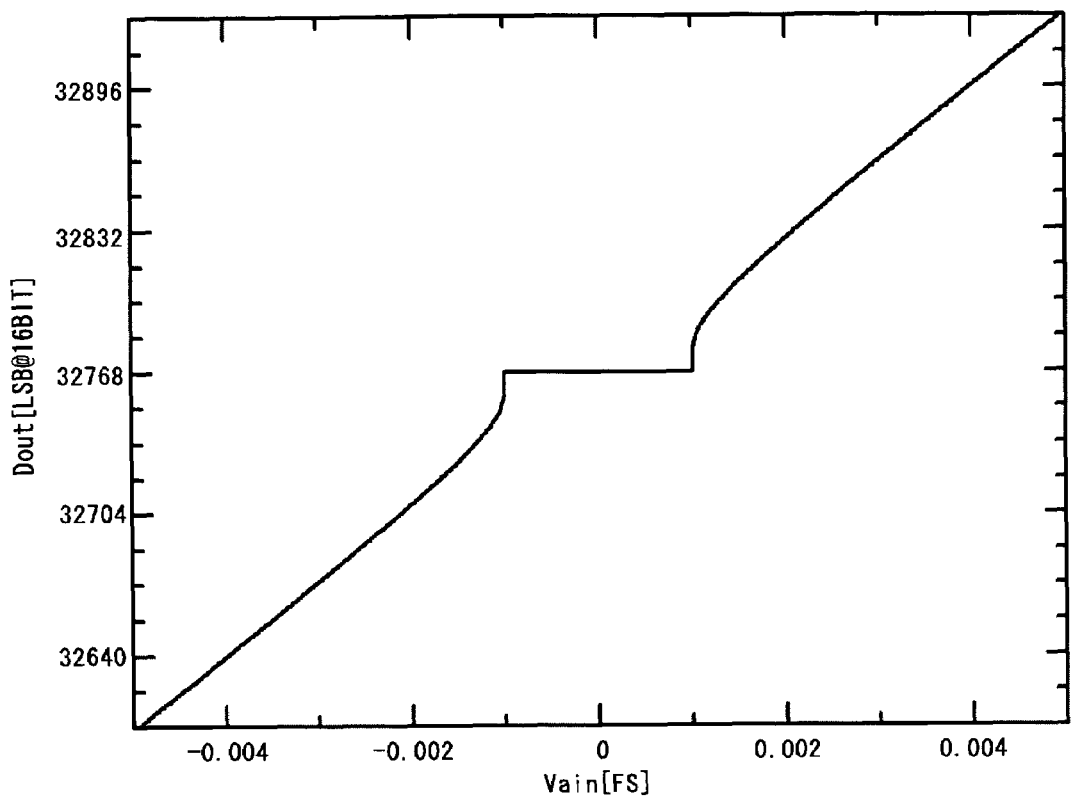
FIG. 7 shows output characteristics when an analog input signal of the $\Delta\Sigma$ ADC in FIG. 6 is in the vicinity of zero.
Figure 8:
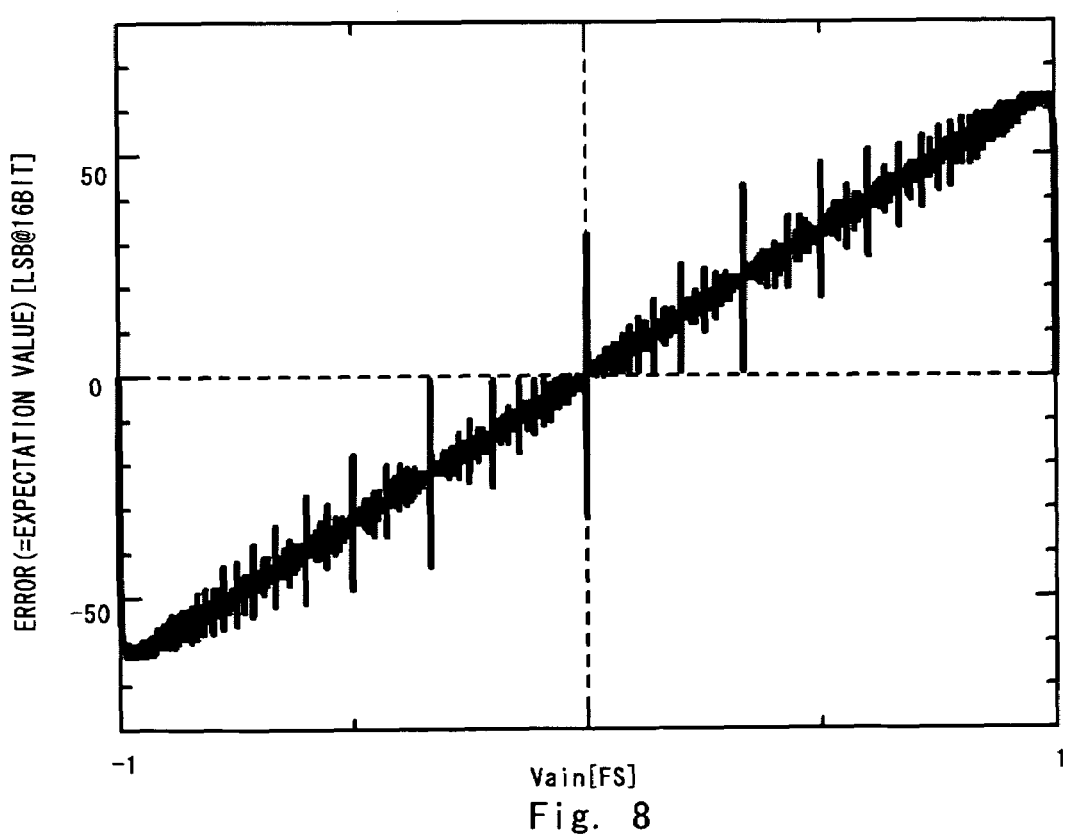
FIG. 8 shows input versus error characteristics of the $\Delta\Sigma$ ADC in FIG. 6.
Figure 9:
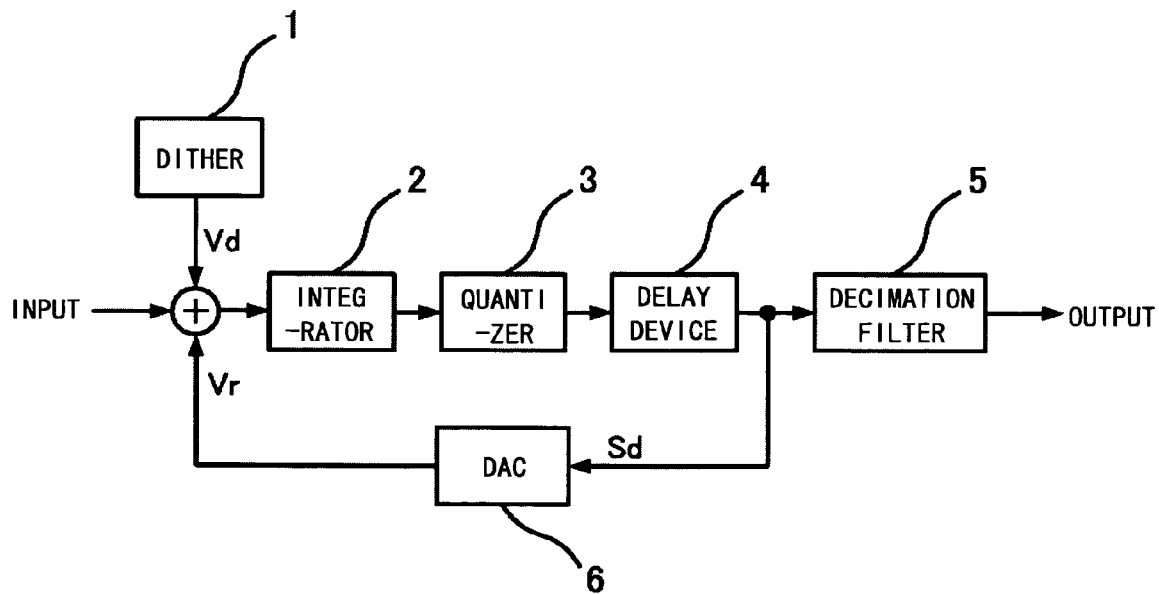
FIG. 9 shows a configuration of a conventional $\Delta\Sigma$ ADC using a single square wave dither signal.
Figure 10:
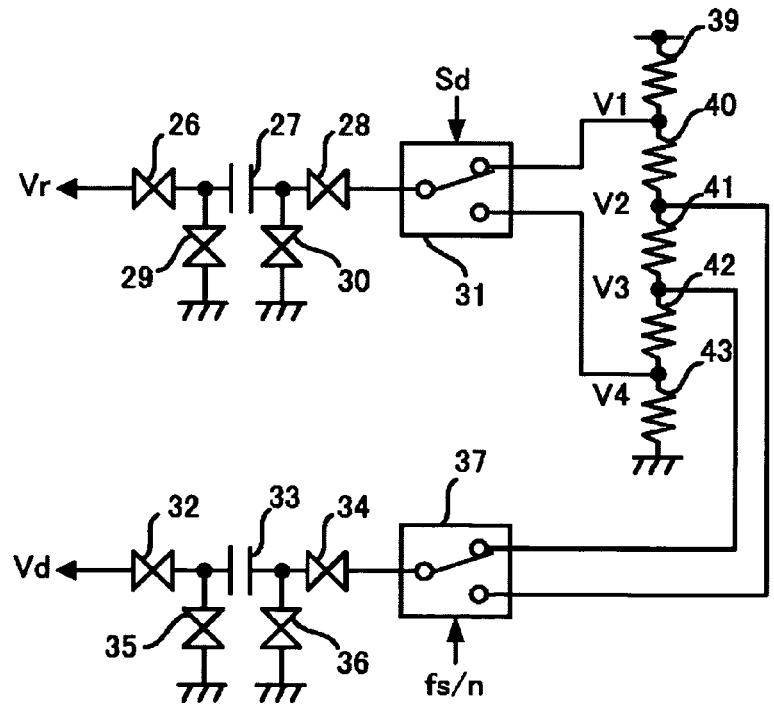
FIG. 10 shows configurations of the dither circuit of the $\Delta\Sigma$ type ADC and a 1-bit DAC shown in FIG. 9, and switched capacitors transmitting charges proportional to signal potentials generated at the dither circuit and the 1-bit DAC to an integral capacitor of an integrator.
Figure 11:
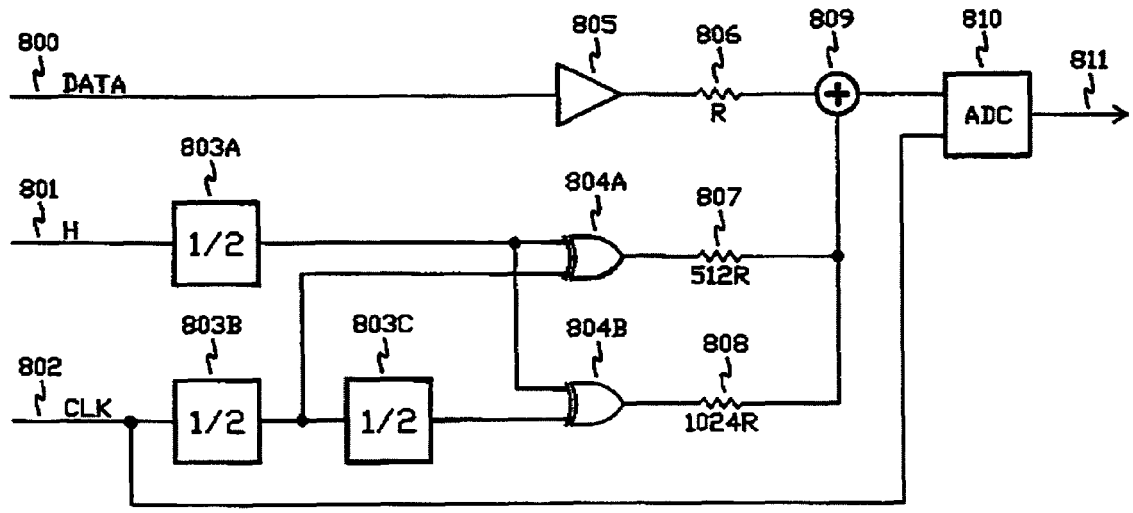
FIG. 11 shows a configuration of the conventional ADC using two square wave dither signals.
Figure 12:
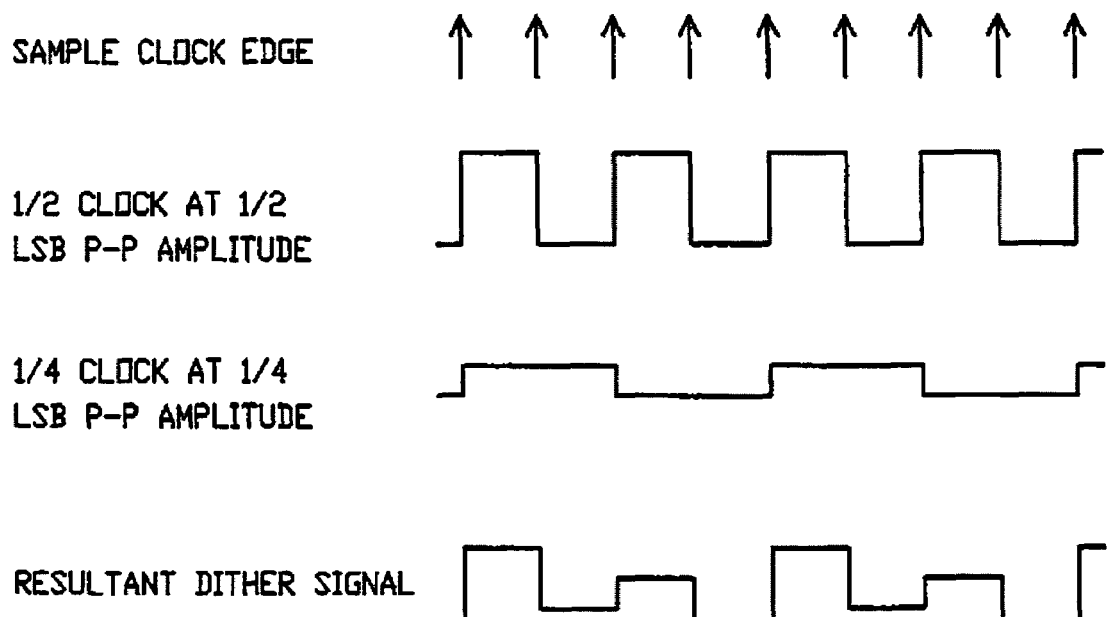
FIG. 12 shows a dither pattern of the conventional ADC shown in FIG. 11.
Figure 13:
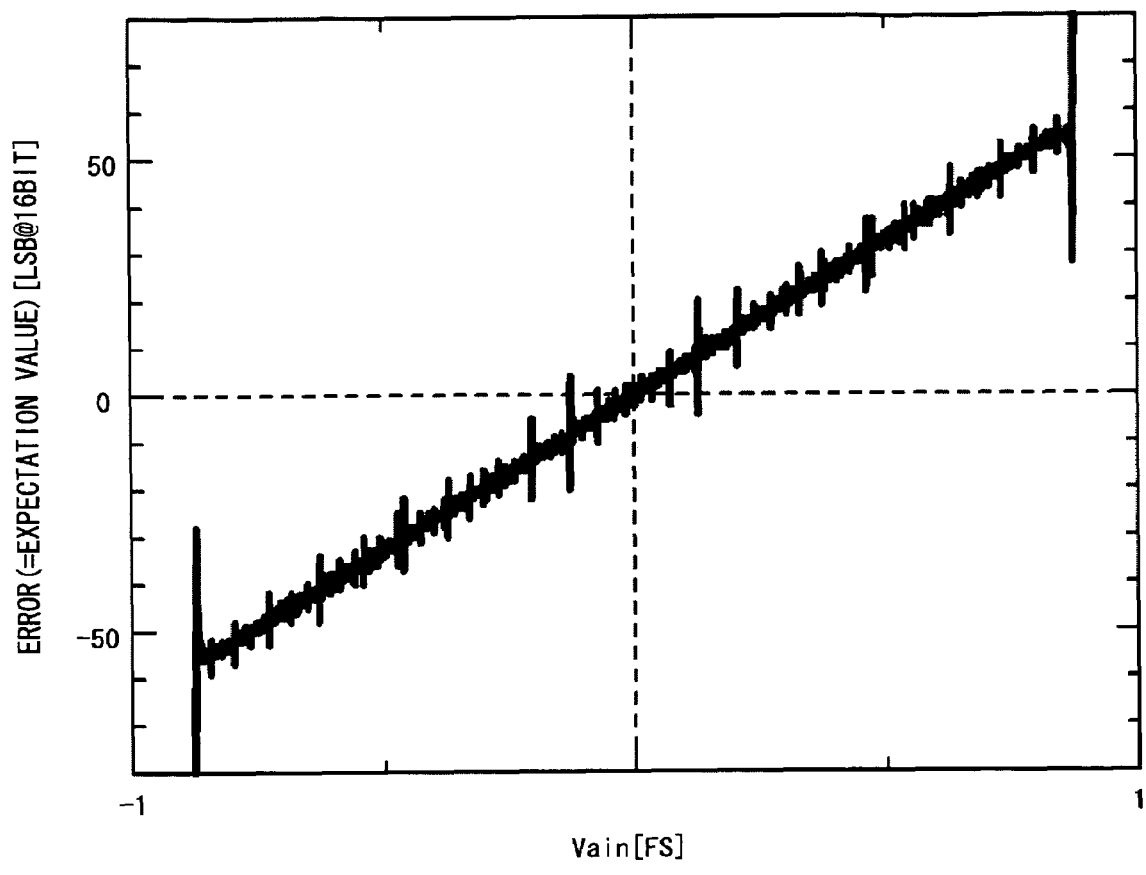
FIG. 13 shows input versus error characteristics of the conventional ADC using the single square wave dither signal.

The present invention will be described further in detail with reference to the drawings. FIG. 1 shows a configuration of one embodiment of the present invention. In FIG. 1, a dither circuit including a dither generating circuit 15 and a dither input circuit 20 is added to a $\Delta\Sigma$ type ADC which is the same as shown in FIG. 6. Referring to FIG. 1, the dither circuit according to the present invention includes the dither generating circuit 15 and the dither input circuit 20. The dither generating circuit 15 divides frequency of clock signal ck and generates a plurality of complementary signal pairs (Vd1, Vd1b), (Vd2, Vd2b), . . . (Vdj, Vdjb) having frequencies of $1/2^n$ (n is an integer of one or more than one) of the clock signal ck. Then the dither generating circuit 15 supplies the generated signal pairs to the dither input circuit 20. The plurality of complementary signal pairs (Vd1, Vd1b), (Vd2, Vd2b), . . . (Vdj, Vdjb) each have different frequencies.

Figure 2:
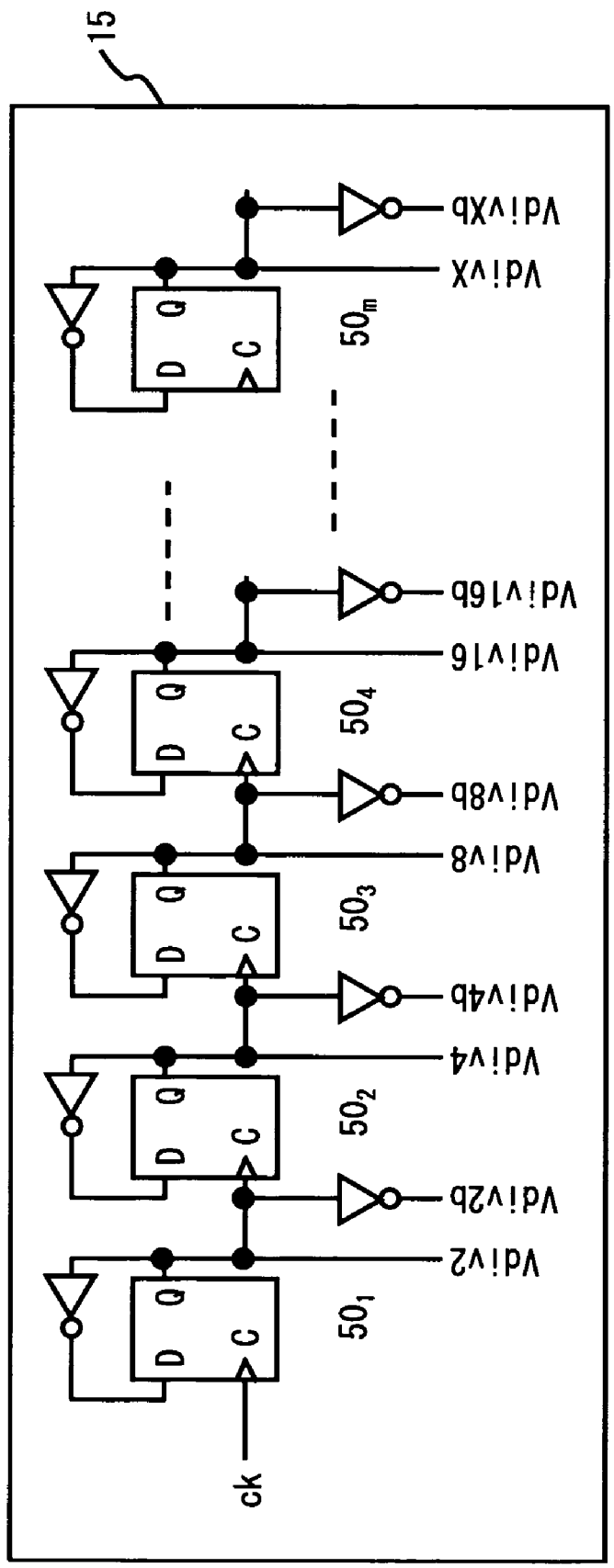
FIG. 2 shows a configuration of a dither generating circuit in the dither circuit according to the present invention.

FIG. 2 shows an example of a configuration of the dither generating circuit 15. Referring to FIG. 2, the dither generating circuit 15 has m (m is an integer of two or more than two) $1/2$ frequency dividing circuits (501, 502, 503, 504, . . . 50m) that are made of D-type flip-flops and inverters connected in series. M $1/2$ frequency dividing circuits generate complementary signal pairs (Vdiv2, Vdiv2b), (Vdiv4, Vdiv4b), (Vdiv8, Vdiv8b), (Vdiv16, Vdiv16b), . . . (VdivX, VdivXb) having amplitude between power source potential VDD and ground potential GND. Then j (j is an integer of two or more than two) complementary signal pairs (Vd1, Vd1b), (Vd2, Vd2b), . . . (Vdj, Vdjb) are selected from among m complementary signal pairs and the selected pairs are supplied to the dither input circuit 20.

Referring again to FIG. 1, the dither input circuit 20 includes capacitors Cd1, Cd2, . . . Cdj, each being provided corresponding to the plurality of complementary signal pairs (Vd1, Vd1b), (Vd2, Vd2b), . . . (Vdj, Vdjb). One ends of the capacitors Cd1, Cd2, . . . Cdj are connected to one ends of the switches forming the switch pairs (Swd1, Swd1b), (Swd2, Swd2b), . . . (Swdj, Swdjb), respectively. The complementary signal pairs (Vd1, Vd1b), (Vd2, Vd2b), . . . (Vdj, Vdjb) are supplied to each of the other ends of the switches forming the switch pairs (Swd1, Swd1b), (Swd2, Swd2b), . . . (Swdj, Swdjb). Each of the other ends of the capacitors Cd1, Cd2, . . . Cdj are connected to an adding point A which is an input of an integrator.

Note that one switches Swd1, Swd2, . . . Swdj of each switch pair are controlled to be closed when the clock signal ck is in active state and controlled to be opened when inverting clock signal ckb is in active state. On the other hand, the other switches Swd1b, Swd2b, . . . Swdjb are controlled to be closed when the inverting clock signal ckb is in active state and controlled to be opened when the clock signal ck is in active state.

Therefore, the signals Vd1, Vd2, . . . Vdj are supplied to each capacitor of the dither input circuit of the present invention in a former part of 1 sampling clock cycle of the ΔΣ type ADC, whereas the inverting signals Vd1b, Vd2b, . . . Vdjb are supplied to each capacitor of the dither input circuit in a latter part of 1 sampling clock cycle.

The first-order ΔΣADC to which the dither circuit of FIG. 1 is added behaves as follows. When the sampling clock ck is in active state, switches SWain and SWsam are closed and charges sampling analog input signal Vain are stored in an input capacitor C1. At this time, the adding point A has ground potential and the charges according to the signals Vd1, Vd2, . . . Vdj are stored in the capacitors Cd1, Cd2, . . . Cdj, respectively.

When the inverting sampling clock ckb is in active state, switches SWdac and SWint are closed, and charges stored in the input capacitor C1 are transmitted to an integral capacitor C2 according to a feedback reference signal Vr. At this time, charges stored in the capacitors Cd1, Cd2, . . . Cdj are also transmitted to the integral capacitor C2 according to the inverting signals Vd1b, Vd2b, . . . Vdjb. Then the integration is performed in the C2 to change the integrator output Vout.

Vd1b, Vd2b, . . . Vdjb are the inverting signals of Vd1, Vd2, . . . Vdj, respectively. Therefore, the charges transmitted to the integral capacitor C2 from the capacitors Cd1, Cd2, . . . Cdj are twice as much as the charges first stored in the Cd1, Cd2, . . . Cdj. In other words, it is possible to decrease the capacitance values of the Cd1, Cd2, . . . Cdj and to suppress the increase in the area. For example, the capacitance values of the Cd1, Cd2, . . . Cdj can be less than 1/10 of the capacitor for the analog signal input C1.

Further, signals output from the dither generating circuit 15 have amplitude between the power source potential VDD and the ground potential GND. Therefore, it is possible for the MOS transistor forming the switches Swd1, Swd2, . . . Swdj and the switches Swd1b, Swd2b, . . . Swdjb to have enough VGS-VTH. Moreover, the values of the capacitors Cd1, Cd2, . . . Cdj are so small that time constant obtained by the capacitors Cd1, Cd2, . . . Cdj and ON resistances of the switches are not changed or can be made small even if ON resistances of those switches are increased. Therefore, it is possible to use transistor which is smaller than the switch inside the ΔΣ modulator so as to further suppress the increase in the area.

Although it is possible to arbitrarily combine the frequencies of the complementary signals input to the dither input circuit 20, the lowest frequency needs to be the frequency that can be removed by the decimation filter 5.

First Embodiment

Figure 3:
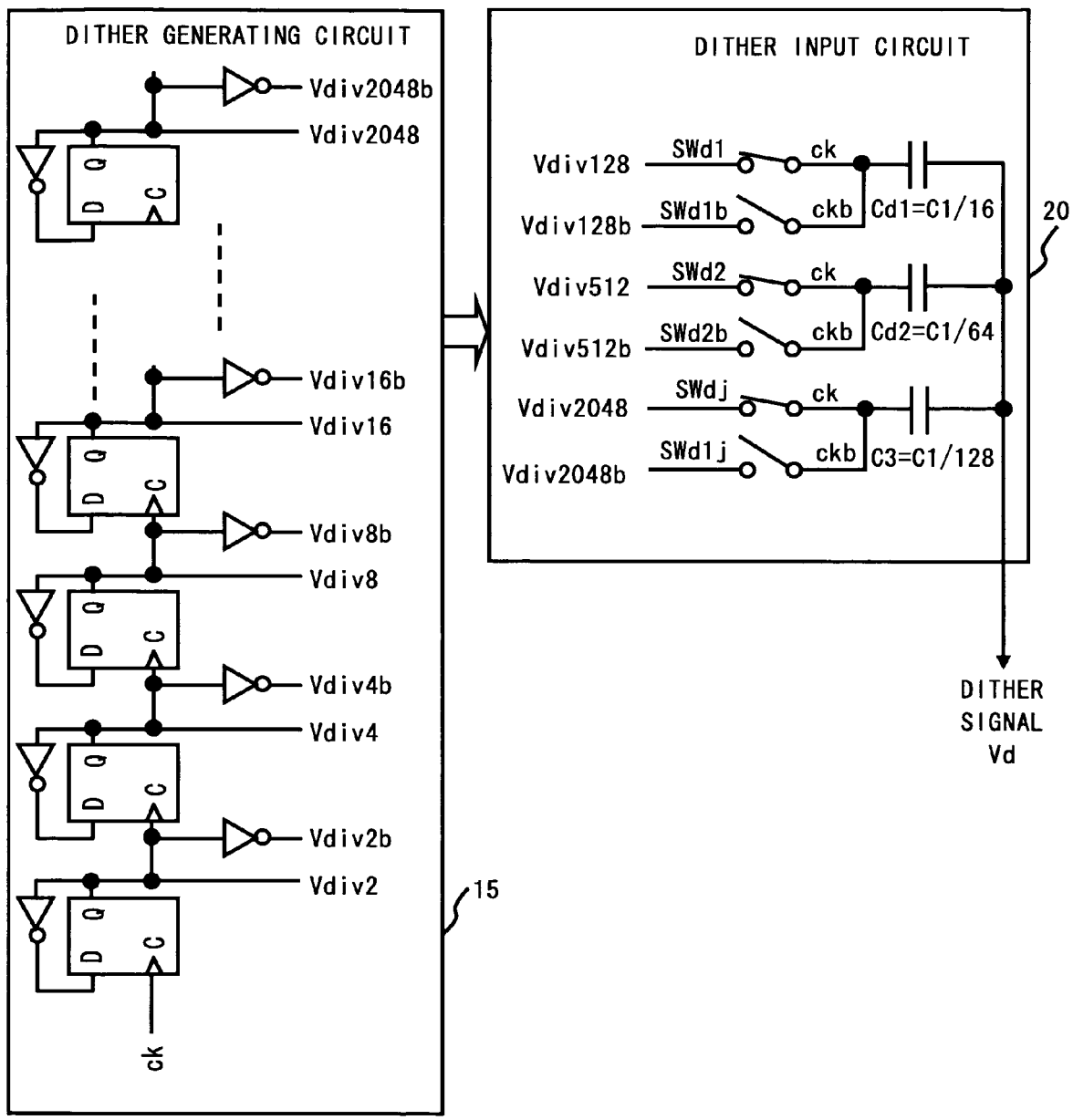
FIG. 3 shows a configuration of the dither circuit according to one embodiment of the present invention.
Figure 4:
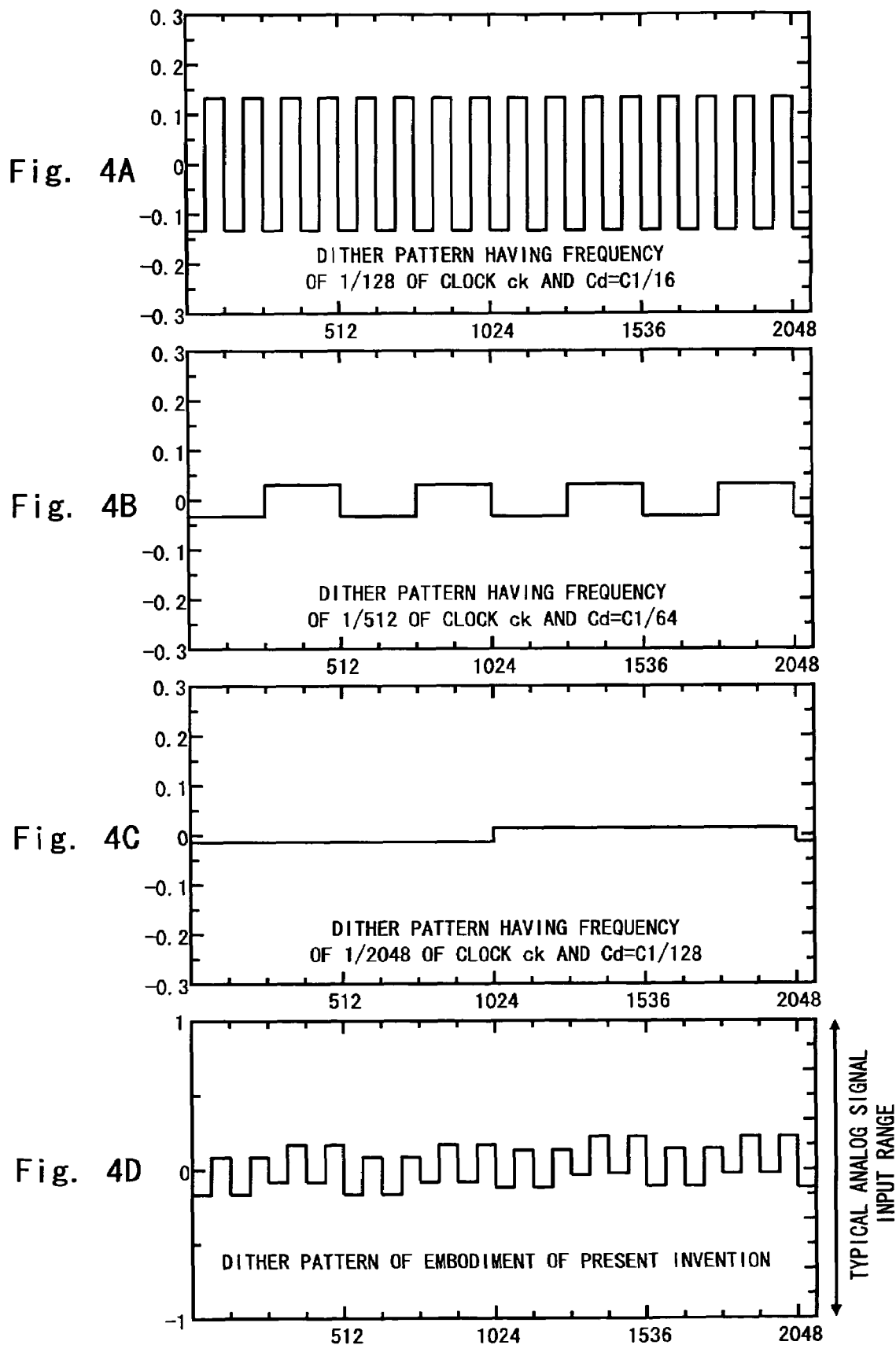
FIG. 4A shows dither patterns according to one embodiment of the present invention.
FIG. 4B shows dither patterns according to one embodiment of the present invention.
FIG. 4C shows dither patterns according to one embodiment of the present invention.
FIG. 4D shows dither patterns according to one embodiment of the present invention.

FIG. 3 shows a configuration of the dither circuit of the embodiment of the present invention. FIGS. 4A to 4D each shows a dither pattern of the embodiment. Referring to FIG. 3, in the dither circuit of the present embodiment, the dither pattern is generated by the dither generating circuit 15 and the dither input circuit 20. The dither generating circuit 15 is made only of the ½ frequency dividing circuit and the inverter. The dither input circuit 20 is made of three switch pairs (Swd1, Swd1b), (Swd2, Swd2b), (Swd3, Swd3b) and three capacitors Cd1, Cd2, Cd3.

In the present embodiment, the dither generating circuit 15 outputs the complementary signal pairs (Vd1, Vd1b), (Vd2, Vd2b), (Vd3, Vd3b) having square wave of the frequencies of 1/128, 1/512, and 1/2048 of the sampling clock ck to the dither input circuit 20. The complementary signal pairs (Vdiv128, Vdiv128b) having the frequency of 1/128 of the sampling clock ck is added to the capacitor Cd1 through the switch pair (Swd1, Swd1b), the complementary signal pairs (Vdiv512, Vdiv512b) having the frequency of 1/512 is added to the capacitor Cd2 through the switch pairs (Swd2, Swd2b), and the complementary signal pairs (Vdiv2048, Vdiv2048b) having the frequency of 1/2048 is added to the capacitor Cd3 through the switch pair (Swd3, Swd3b). The capacitance values of three capacitors Cd1, Cd2, and Cd3 are equal to 1/16, 1/64, and 1/128 of the capacitor for analog signal input C1, respectively. The dither signals Vd output from the dither input circuit 20 are added to the adding point A of the ΔΣ modulator 10 having the same configuration as that shown in FIG. 1. Note that a selector can also be provided. The selector selects the complementary signal pairs having the frequencies of 1/128, 1/512, and 1/2048 of the sampling clock ck from among the plurality of complementary signal pairs generated from the dither generating circuit 15 and supplies the selected pairs to the dither input circuit 20.

Figure 5:
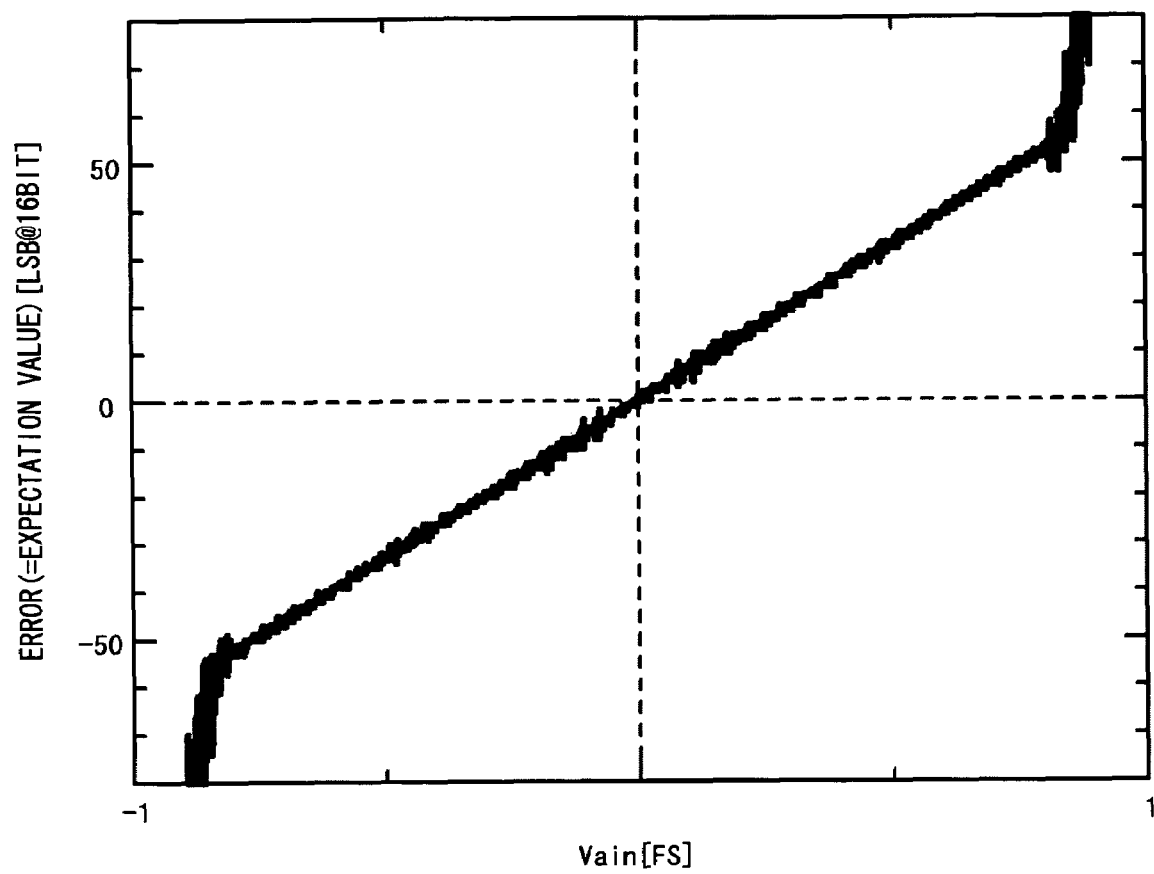
FIG. 5 shows input versus error characteristics of the $\Delta\Sigma$ ADC to which the dither circuit according to the present invention is added.

FIG. 5 shows input versus error characteristics of the ΔΣADC to which the present embodiment is applied. It can be seen from FIG. 5 that the ΔΣADC indicates good input versus error characteristics.

It is apparent that the present invention is not limited to the above embodiments, but may be modified and changed without departing from the scope and spirit of the invention.

What is claimed is:

1. A dither circuit comprising:
a dither generating circuit generating a plurality of complementary signal pairs; and
a dither input circuit generating a plurality of pairs of dither signals from the plurality of complementary signal pairs to add the generated dither signals to an analog input signal, wherein
the plurality of complementary signal pairs have different frequencies with each other,
the dither input circuit includes capacitors provided for each of the plurality of complementary signal pairs and a plurality of switch pairs including first and second switches having one terminals connected to each one terminal of the capacitors, and the other terminals of the capacitors are connected to an adding point to the analog input signal, the first switch supplies ones of the complementary signal pairs to one terminals of the capacitors when a clock signal is in effective state, and the second switch supplies the others of the complementary signal pairs to one terminals of the capacitors when an inverting clock signal of the clock signal is in effective state.

2. The dither circuit according to claim 1, wherein each capacitor has different capacitance value with each other.

3. The dither circuit according to claim 1, wherein each signal of the complementary signal pairs has amplitude between power source potential and ground potential.

4. The dither circuit according to claim 1, wherein the dither generating circuit includes a frequency divider generating the complementary signal pairs having a plurality of frequencies of $½^n$ (n is an integer of one or more than one) of the clock signal.

5. The dither circuit according to claim 4 comprising a selector selecting complementary signal pairs generated by the dither generating circuit to supply the selected complementary signal pairs to the dither input circuit.

6. The dither circuit according to claim 1, wherein the dither generating circuit comprises:
   a plurality of D-type flip-flops connected in a sequential manner, wherein a Q-output of one of the D-type flip-flops is connected to a D-input of the one of the D-type flip-flops and to a Clock input of a succeeding one of the D-type flip-flops that are connected in the sequential manner.

7. An analog digital converter comprising:
   a dither circuit including;
   a dither generating circuit generating a plurality of complementary signal pairs; and
   a dither input circuit generating a plurality of pairs of dither signals from the plurality of complementary signal pairs to add the generated dither signals to an analog input signal, wherein
   the plurality of complementary signal pairs have different frequencies with each other,
   the dither input circuit includes capacitors provided for each of the plurality of complementary signal pairs and a plurality of switch pairs including first and second switches having one terminals connected to each one terminal of the capacitors, and
   the other terminals of the capacitors are connected to an adding point to the analog input signal, the first switch supplies ones of the complementary signal pairs to one terminals of the capacitors when a clock signal is in effective state, and the second switch supplies the others of the complementary signal pairs to one terminals of the capacitors when an inverting clock signal of the clock signal is in effective state.

8. The analog digital converter according to claim 7, wherein each capacitor has different capacitance value with each other.

9. The analog digital converter according to claim 7, wherein each signal of the complementary signal pairs has amplitude between power source potential and ground potential.

10. The analog digital converter according to claim 7, wherein the dither generating circuit includes a frequency divider generating the complementary signal pairs having a plurality of frequencies of $½^n$ (n is an integer of one or more than one) of the clock signal.

11. The analog digital converter according to claim 10 comprising a selector selecting complementary signal pairs generated by the dither generating circuit to supply the selected complementary signal pairs to the dither input circuit.

12. The analog digital converter according to claim 7, wherein the analog digital converter is a delta sigma type analog digital converter.

13. The analog digital converter according to claim 12 comprising a switched capacitor type integrator, wherein the other ends of each capacitor of the dither input circuit is connected to a connecting point of a capacitor for analog signal input and an integral capacitor.

14. The analog digital converter according to claim 13, wherein the capacitance values of each capacitor of the dither input circuit are less than $1/10$ of the capacitance value of the capacitor for analog signal input.

15. The analog digital converter according to claim 6, wherein the dither generating circuit comprises:
   a plurality of D-type flip-flops connected in a sequential manner, wherein a Q-output of one of the D-type flip-flops is connected to a D-input of the one of the D-type flip-flops and to a Clock input of a succeeding one of the D-type flip-flops that are connected in the sequential manner.

* * * * *